(12) United States Patent
Chi et al.

(10) Patent No.: US 8,274,321 B2
(45) Date of Patent: Sep. 25, 2012

(54) FUSE CIRCUIT AND OPERATION METHOD THEREOF

(75) Inventors: Sung-Soo Chi, Gyeonggi-do (KR); Ki-Chang Kwean, Gyeonggi-do (KR); Woo-Young Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 2 days.

(21) Appl. No.: 12/956,368

(22) Filed: Nov. 30, 2010

(65) Prior Publication Data

US 2011/0128068 A1 Jun. 2, 2011

(30) Foreign Application Priority Data

Nov. 30, 2009 (KR) .................. 10-2009-0117446
Feb. 28, 2010 (KR) .................. 10-2010-0018294

(51) Int. Cl.
*G11C 17/16* (2006.01)
*H01H 85/00* (2006.01)

(52) U.S. Cl. ................. 327/525; 326/38; 365/225.7

(58) Field of Classification Search .............. None
See application file for complete search history.

(56) References Cited

U.S. PATENT DOCUMENTS 6,566,937 B1 * 5/2003 Mori et al. ............ 327/525
7,565,518 B2 * 7/2009 Kuroda ................... 713/1
2011/0235453 A1 * 9/2011 Chi et al. ................ 365/225.7

FOREIGN PATENT DOCUMENTS

| JP | 2009-081188 | 4/2009 |
| KR | 1020050102305 | 10/2005 |
| KR | 1020060074721 | 7/2006 |
| KR | 1020090097553 | 9/2009 |

OTHER PUBLICATIONS

Notice of Preliminary Rejection issued from Korean Intellectual Property Office on Apr. 4, 2011.
Notice of Preliminary Rejection issued from Korean Intellectual Property Office on Apr. 27, 2011.
Notice of Allowance issued by the Korean Intellectual Property Office on Nov. 30, 2011.

* cited by examiner

*Primary Examiner* — Lincoln Donovan
*Assistant Examiner* — Terry L Englund
(74) *Attorney, Agent, or Firm* — IP & T Group LLP (57) ABSTRACT

A fuse circuit includes a control signal generation unit configured to generate a control signal that is enabled after a moment when a power-up signal is enabled, a potential control unit configured to control potentials of both ends of a fuse in response to the control signal, and a fuse output unit configured to be initialized in response to the power-up signal and output a fuse signal in response to whether the fuse is cut or not.

14 Claims, 6 Drawing Sheets

FUSE CIRCUIT AND OPERATION METHOD THEREOF

CROSS-REFERENCE TO RELATED APPLICATIONS

The present application claims priority of Korean Patent Application Nos. 10-2009-0117446 and 10-2010-0018294, filed on Nov. 30, 2009, and Feb. 28, 2010, respectively, which are incorporated herein by reference in their entirety.

BACKGROUND OF THE INVENTION

Exemplary embodiments of the present invention relate to a semiconductor memory designing technology, and more particularly, to a fuse circuit including a programmable fuse and a method for operating the same.

In general, a semiconductor memory device is integrated with a lot of memory cells. If any one of the memory cells has a failure, the semiconductor memory device including the memory cell with a failure is recognized as a defective product and abandoned. Since the number of memory cells integrated in a semiconductor memory device is increasing more and more, it is not economical to abandon a semiconductor memory device just because one memory cell has a failure.

To resolve this problem, semiconductor memory devices include a fuse circuit along with a redundancy memory cell. The fuse circuit is programmed with the address of a memory cell having a failure, and is used to determine whether or not to access a redundancy memory cell. Herein, the term "program" means a series of operations of cutting or not cutting a fuse included in the fuse circuit for a corresponding target data. Generally, a fuse is cut using laser beam.

Meanwhile, a cut fuse may subsequently undergo an electrical and chemical migration. As a result of this phenomenon the fuse may become reconnected. A reconnected fuse is an undesirable defect and may cause a failure in the semiconductor device. Such a failure frequently occurs when copper is used as a material for metal wiring, but it may occur when aluminum or other materials are used. Also, such a phenomenon may occur during a test operation performed at a high temperature and high voltage. Subsequently, since the failure may occur after a packaging process, it is difficult to detect the failure and even if such a failure is found out, it is hard to correct the circuit. Therefore, such a failure becomes a factor of deteriorated productivity, performance and reliability of semiconductor memory devices.

SUMMARY OF THE INVENTION

Exemplary embodiments of the present invention are directed to a semiconductor memory device which may control the potential of both ends of a fuse after a power-up operation.

In accordance with an exemplary embodiment of the present invention, a fuse circuit includes a control signal generation unit configured to generate a control signal that is enabled after a moment when a power-up signal is enabled, a potential control unit configured to control potentials of both ends of a fuse in response to the control signal, and a fuse output unit configured to be initialized in response to the power-up signal and output a fuse signal in response to whether the fuse is cut or not.

In accordance with another exemplary embodiment of the present invention, a method for operating a fuse circuit includes initializing a sense node where a value corresponding to whether a fuse is cut or not is detected in response to a power-up signal, driving the sense node by detecting whether the fuse is cut or not, outputting a fuse signal corresponding to whether the fuse is cut or not based on a logic level of the sense node, and controlling potentials of both ends of the fuse after the driving of the sense node.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1A:
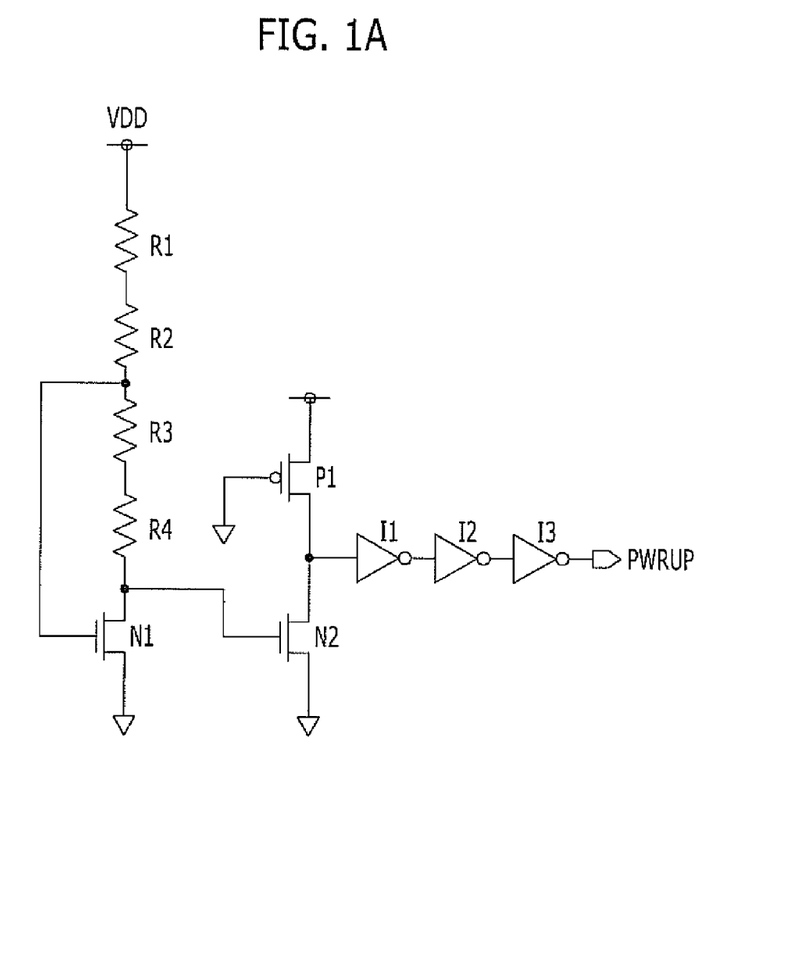
FIG. 1A is a circuit diagram illustrating a power-up circuit of a semiconductor memory device in accordance with an exemplary embodiment of the present invention.
Figure 1B:
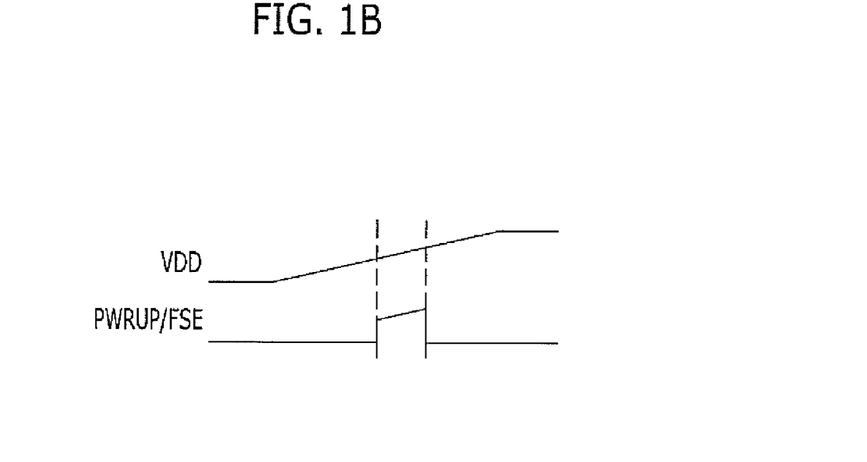
FIG. 1B is a waveform diagram of the power-up circuit shown in FIG. 1A.

FIG. 1A is a circuit diagram illustrating a power-up circuit of a semiconductor memory device for describing an exemplary embodiment of the present invention. FIG. 1B is a waveform diagram of the power-up circuit shown in FIG. 1A.

Referring to FIG. 1A, the power-up circuit includes a plurality of resistors R1, R2, R3, and R4, a first PMOS transistor P1, first and second NMOS transistors N1 and N2, and first to third inverters I1, I2, and I3. FIG. 1B illustrates an operation of the power-up circuit, and in particular, shows that the voltage level of a supplied power source voltage VDD increases gradually. Subsequently, when the voltage level of the power source voltage VDD is increased higher than a predetermined voltage level, a power-up signal PWRUP transitions to a logic high level and then transitions back to a logic low level. In other words, the power-up signal PWRUP becomes a pulse-type signal. Herein, the power-up signal PWRUP becomes a source signal generating a fuse enable signal FSE, which is described below with reference to FIG. 2A.

Figure 2A:
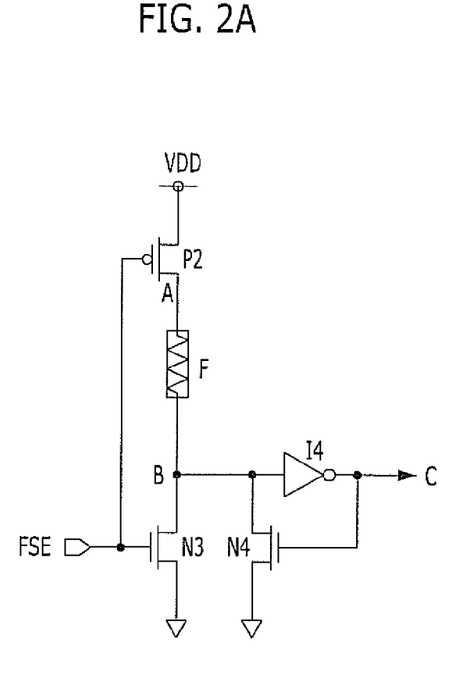
FIG. 2A is a circuit diagram illustrating a fuse circuit of a semiconductor memory device in accordance with an exemplary embodiment of the present invention.
Figure 2B:
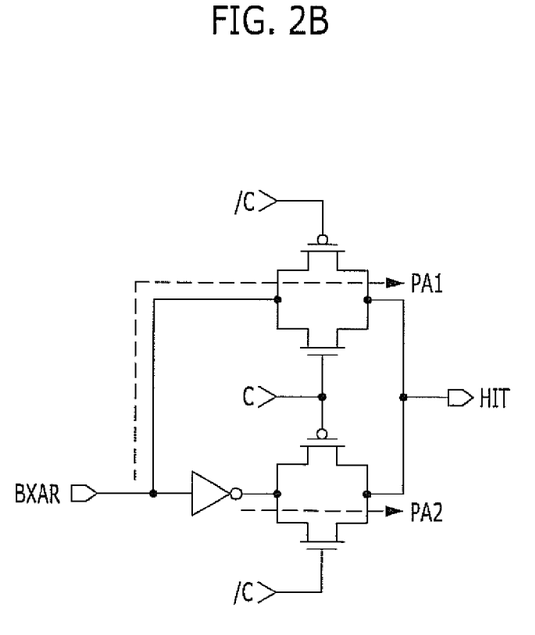
FIG. 2B is a circuit diagram illustrating an address transfer circuit of the semiconductor memory device shown in FIG. 2A.

FIG. 2A is a circuit diagram illustrating a fuse circuit of a semiconductor memory device for describing an exemplary embodiment of the present invention, and FIG. 2B is a circuit diagram illustrating an address transfer circuit of the semiconductor memory device shown in FIG. 2A.

Referring to FIG. 2A, the fuse circuit includes a fuse F, a second PMOS transistor P2, a third NMOS transistor N3, a fourth inverter I4, and a fourth NMOS transistor N4. The fuse F is coupled between an A node and a B node. The second PMOS transistor P2 receives a fuse enable signal FSE at its gate input and has source/drain terminals coupled to the power source voltage VDD and the A node. The third NMOS transistor N3 receives the fuse enable signal FSE at its gate input and has source/drain terminals coupled to a ground power source voltage VSS and the B node. The input of the fourth inverter I4 is coupled with the B node and the fourth inverter I4 outputs a fuse signal C. The fourth NMOS transistor N4 receives the fuse signal C at its gate input and has source/drain terminals coupled to the ground power source voltage VSS and the B node. Herein, the fuse enable signal FSE is a signal generated by buffering the power-up signal PWRUP. Thus, the two signals are almost the same.

The address transfer circuit includes two transfer gates which input an address signal BXAR and output the address signal BXAR as a hit signal HIT in response to the fuse signal C and a fuse bar signal /C (i.e., an inverse of the fuse signal C). In other words, the address signal BXAR is outputted as the hit signal HIT through one of two different output paths PA1 and PA2.

Meanwhile, the semiconductor memory device includes a plurality of address transfer circuits and each of the plurality of the address transfer circuits generates a hit signal HIT. In short, a plurality of hit signals HIT as shown in FIG. 3 are generated.

Figure 3:
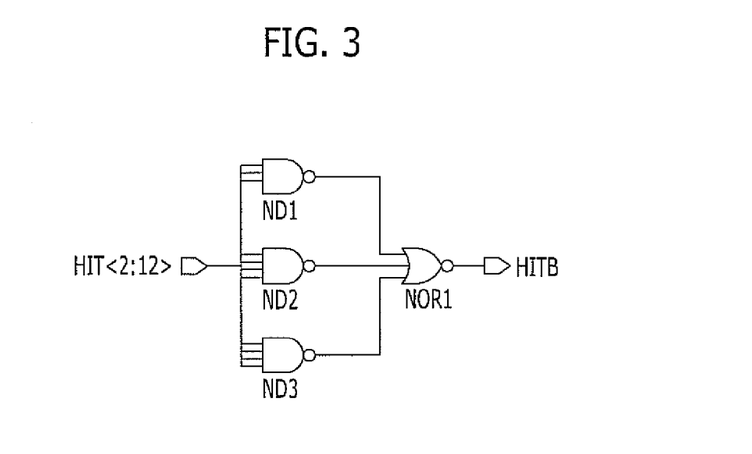
FIG. 3 is a circuit diagram illustrating a signal combiner of a semiconductor memory device in accordance with an exemplary embodiment of the present invention.

FIG. 3 is a circuit diagram illustrating a signal combiner of a semiconductor memory device for describing an exemplary embodiment of the present invention.

Referring to FIG. 3, the signal combiner includes first to third NAND gates ND1, ND2 and ND3 and a first NOR gate NOR1. The signal combiner generates a repair signal HITB by combining multiple hit signals HIT (e.g., HIT<2:12>). Herein, the repair signal HITB being enabled signifies that an address signal inputted during a normal operation accesses a memory cell which is to be repaired. Accordingly, the semiconductor memory device may access a redundancy memory cell in response to the repair signal HITB.

Figure 4:
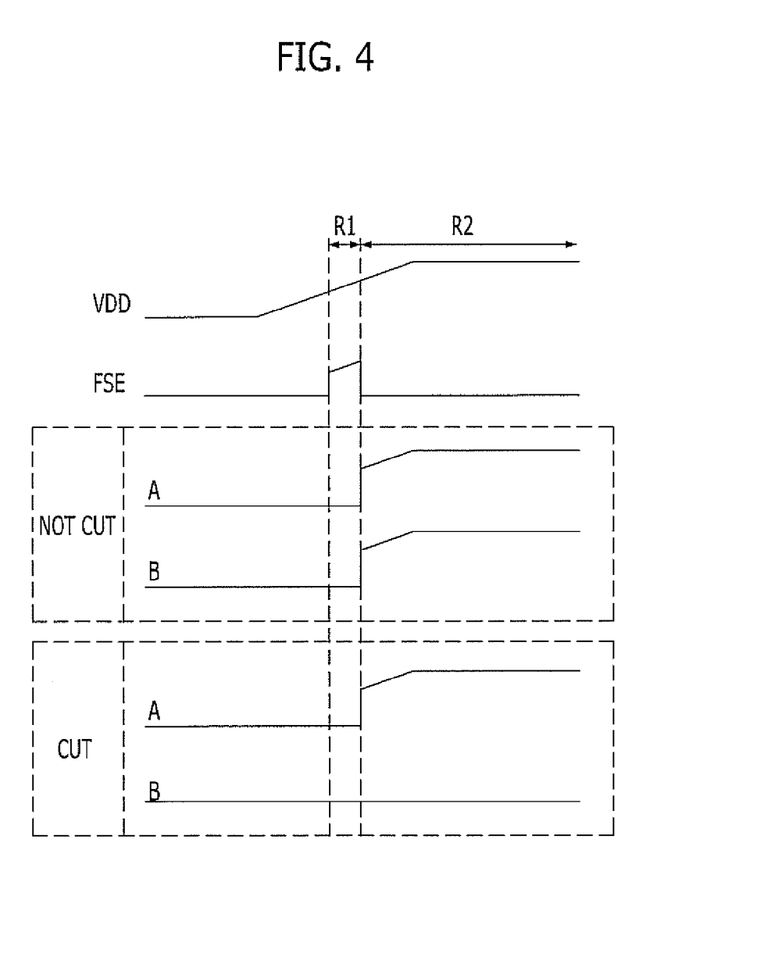
FIG. 4 is a waveform diagram illustrating an operation of the fuse circuit shown in FIG. 2.

FIG. 4 is a waveform diagram illustrating an operation of the fuse circuit shown in FIG. 2.

Referring to FIGS. 2 and 4, the third NMOS transistor N3 is turned on in a first duration R1 where the fuse enable signal FSE is enabled to a logic high level, and the B node is driven with the ground power source voltage VSS. Subsequently, in a second duration R2 where the fuse enable signal FSE transitions to a logic low level, the third NMOS transistor N3 is turned off and the second PMOS transistor P2, which is coupled to the opposite end of the fuse F, is turned on.

In the second duration R2, when the fuse F is not cut, the A node and the B node both have a voltage level equal to the power source voltage VDD level. During the second duration R2, when the fuse F is cut, the voltage level at the A node becomes the power source voltage VDD level while the B node maintains the ground power source voltage VSS level.

Therefore, after the power-up signal PWRUP is enabled, if the fuse F is not cut, the fuse signal C maintains the logic low level, but if the fuse F is cut, the fuse signal C maintains the logic high level. The fuse signal C is maintained until the semiconductor memory device is cut off from a power supply.

Meanwhile, when the fuse F is cut, the cutting state should be maintained. However, electrical/chemical migration may occur and the semiconductor memory device may operate as if the fuse F is not cut even if it has been. In this case, the semiconductor memory device does not access a target memory cell and thus the semiconductor memory device does not perform a desired operation.

In the fuse circuit in accordance with an exemplary embodiment of the present invention, which is described hereafter, it is possible to make both ends of the fuse F not driven with the power source voltage VDD and the ground power source voltage VSS by controlling the potentials of both ends of the fuse F after a power-up operation.

Figure 5:
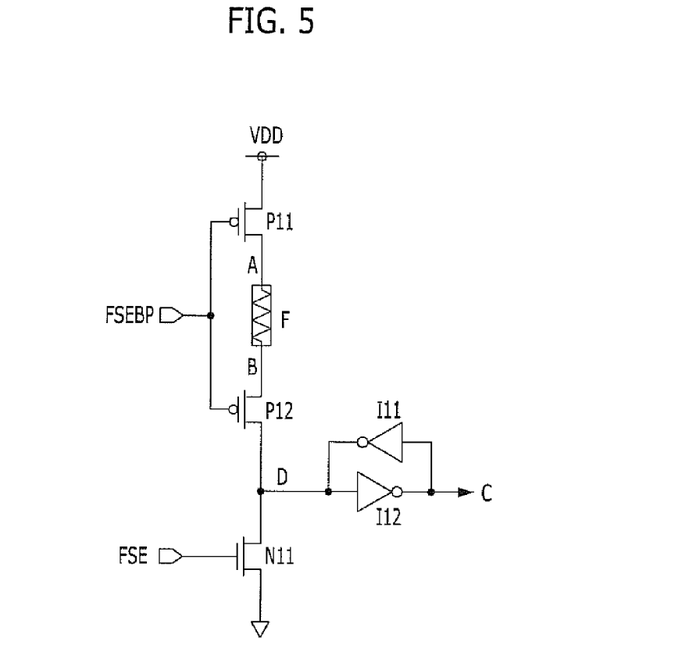
FIG. 5 is a circuit diagram describing a fuse circuit in accordance with an exemplary embodiment of the present invention.

FIG. 5 is a circuit diagram describing a fuse circuit in accordance with an exemplary embodiment of the present invention.

Referring to FIG. 5, the fuse circuit includes potential control units P11 and P12 for controlling the potentials of both ends of a fuse F in response to a fuse enable control signal FSEBP, and fuse output units N11, I11 and I12 which are initialized in response to a power-up signal PWRUP and output a fuse signal C in response to whether the fuse F is cut or not.

Herein, the potential control units P11 and P12 include the fuse F, a first PMOS transistor P11 and a second PMOS transistor P12. The fuse F is coupled between an A node and a B node. The first PMOS transistor P11 receives the fuse enable control signal FSEBP at its gate input and has source/drain terminals coupled to a power source voltage VDD and the A node. The second PMOS transistor P12 receives the fuse enable control signal FSEBP at its gate input and has source/drain terminals coupled to the B node and a D node.

The fuse output units N11, I11 and I12 include an initializer N11 for initializing the D node, which is a sense node of the fuse F, in response to the power-up signal PWRUP, and inverters I11 and I12 for latching logic level values in response to the voltage level of the D node.

The initializer N11 includes a first NMOS transistor N11, which receives the fuse enable signal FSE at its gate input and has source/drain terminals coupled to the ground power source voltage VSS and the D node. The inverters I11 and I12 are arranged such the input of inverter I11 is coupled to the output of inverter I12 and the input of inverter I12 is coupled to the output of inverter I11. Accordingly, the inverters I11 and I12 are coupled together to form a latch. Herein, the fuse enable signal FSE is a signal generated by buffering the power-up signal PWRUP. Therefore, the two signals are almost the same. The fuse enable control signal FSEBP is a signal generated based on the power-up signal PWRUP. Further description on the fuse enable control signal FSEBP is described herein with reference to FIGS. 6 and 7.

Figure 6:
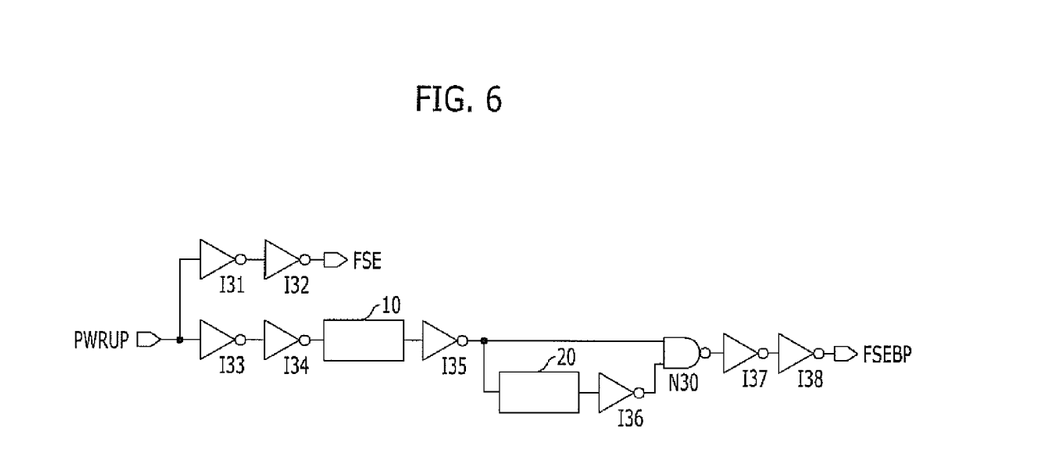
FIG. 6 is a circuit diagram illustrating a control signal generator shown in FIG. 5 for generating a fuse enable signal FSE and a fuse enable control signal FSEBP.

FIG. 6 is a circuit diagram illustrating a control signal generator shown in FIG. 5 for generating a fuse enable signal FSE and a fuse enable control signal FSEBP. In the drawing of FIG. 6, first and second inverters I31 and I32 for generating the fuse enable signal FSE are illustrated.

Referring to FIG. 6, the control signal generator generates the fuse enable control signal FSEBP, so that the fuse enable control signal FSEBP is enabled after the moment when the power-up signal PWRUP is enabled. The control signal generator includes first delay units I33, I34, 10 and I35, second delay units 20 and I36, and output units N30, I37 and I38.

The first delay units I33, I34, 10 and I35 include third to fifth inverters I33, I34 and I35 and delay a disabling moment of the power-up signal PWRUP by a first delay time. The second delay units 20 and I36 include a second delay circuit 20 and a sixth inverter I36 and delay an output signal of the fifth inverter I35 by a second delay time. The output units N30, I37 and I38 include a NAND gate N30 and seventh and eighth inverters I37 and I38 and generate the fuse enable control signal FSEBP in response to the output signals of the fifth inverter I35 and the sixth inverter I36.

Figure 7:
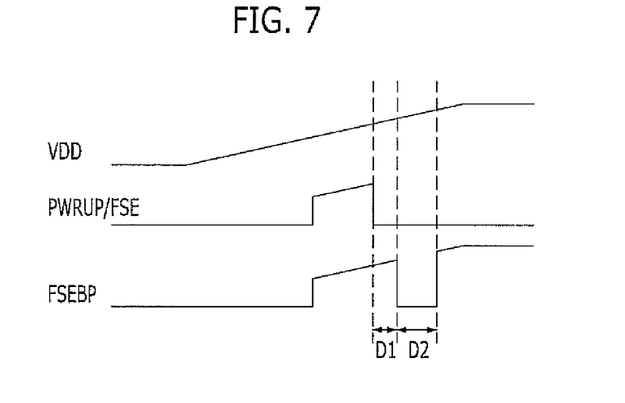
FIG. 7 is an operation waveform diagram illustrating a circuit operation of the control signal generator shown in FIG. 6.

FIG. 7 is an operation waveform diagram illustrating a circuit operation of the control signal generator shown in FIG. 6.

Referring to FIG. 7, the operation timings of the power-up signal PWRUP, the fuse enable signal FSE, and the fuse enable control signal FSEBP when the power source voltage VDD is applied may be known. Herein, 'D1' denotes a delay time caused by the first delay units I33, I34, 10 and I35, and 'D2' denotes a delay time caused by the second delay units 20 and I36. The fuse enable control signal FSEBP is a signal which transitions to a logic low level after the delay time D1 elapses from a moment when the power-up signal PWRUP is disabled. A duration for which the fuse enable control signal FSEBP is a logic low level corresponds to a time when whether or not the fuse F is cut is detected.

Figure 8:
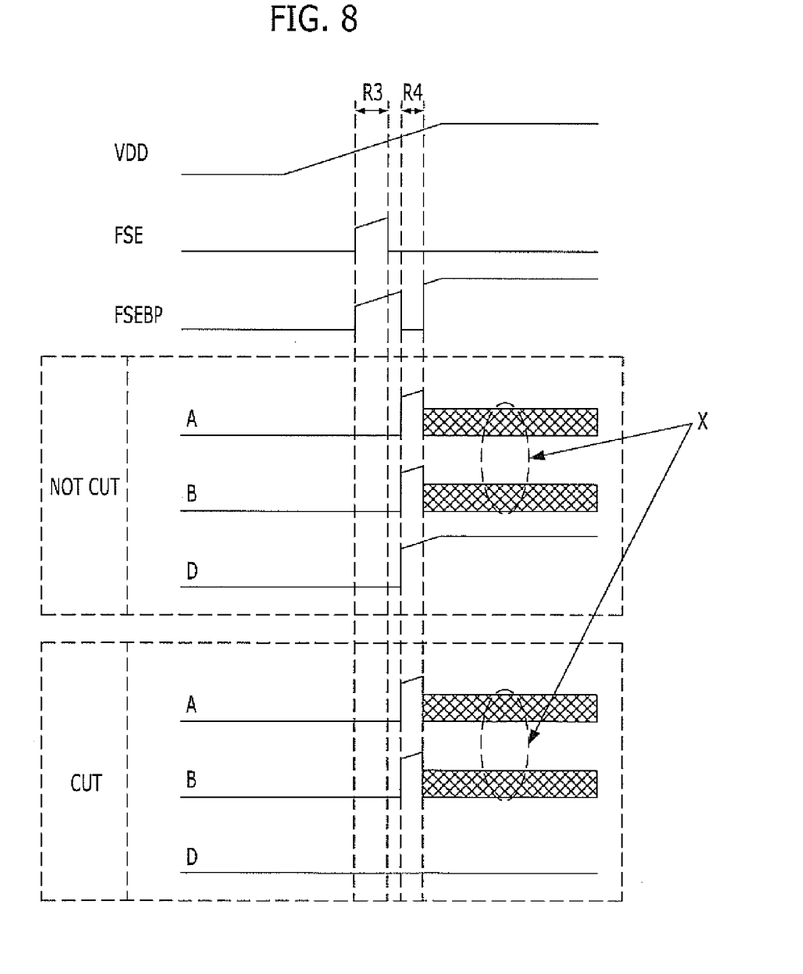
FIG. 8 is an operation waveform diagram illustrating an operation of the fuse circuit shown in FIG. 5.

FIG. 8 is an operation waveform diagram illustrating an operation of the fuse circuit shown in FIG. 5.

Referring to FIGS. 5 and 8, when the fuse enable signal FSE is enabled to a logic high level by the power-up signal PWRUP, the D node is discharged to the ground power source voltage VSS level. Subsequently, when the fuse enable control signal FSEBP becomes a logic low level, the first and second PMOS transistors P11 and P12 are turned on. Therefore, the D node transitions to a logic high level when the fuse F is not cut. When the fuse F is cut, the D node maintains the logic low level. In other words, a duration R3 is a duration where the D node is discharged, and in a duration R4, whether the fuse F is cut or not is detected.

Meanwhile, after whether the fuse F is cut or not is detected, the fuse enable control signal FSEBP returns to a logic high level. Therefore, the first and second PMOS transistors P11 and P12, coupled to opposite ends of the fuse F, are turned off, and both ends of the fuse F maintain a floating state.

In short, after whether the fuse F is cut or not is detected, both ends of the fuse F are controlled to have the potential of the floating state all the time, as indicated by X shown in FIG. 8.

Figure 9:
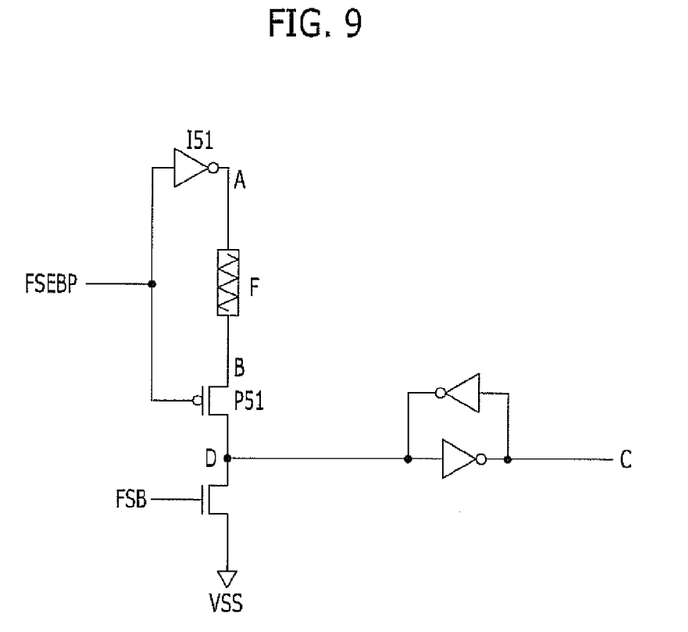
FIG. 9 is a circuit diagram illustrating a fuse circuit in accordance with another exemplary embodiment of the present invention.

FIG. 9 is a circuit diagram illustrating a fuse circuit in accordance with another exemplary embodiment of the present invention. For the sake of convenience in description, different parts from that of the exemplary embodiment described in FIG. 5 are described herein.

The fuse circuit of FIG. 9 includes potential control units I51 and P51 for controlling the potentials of both ends of a fuse F. The potential control units I51 and P51 include a first inverter I51 and a first PMOS transistor P51. The first inverter I51 drives one end of the fuse F in response to the fuse enable control signal FSEBP. An A node, which is at one end of the fuse F, is driven with the power source which is supplied to the first inverter I51 based on the fuse enable control signal FSEBP. When the power source voltage VDD and the ground power source voltage VSS are applied to the first inverter I51, the A node is driven with the power source voltage VDD and the ground power source voltage VSS in response to the fuse enable control signal FSEBP.

The first PMOS transistor P51 cuts off the fuse F and the D node from each other in response to the fuse enable control signal FSEBP, and the B node and the D node are cut off from each other or coupled with each other based on the fuse enable control signal FSEBP.

In the above-described embodiment of the present invention it is also possible to control the potentials of the A node and the B node after the power-up signal PWRUP is enabled. This signifies that the fuse F may be prevented from causing operation defects.

Figure 10:
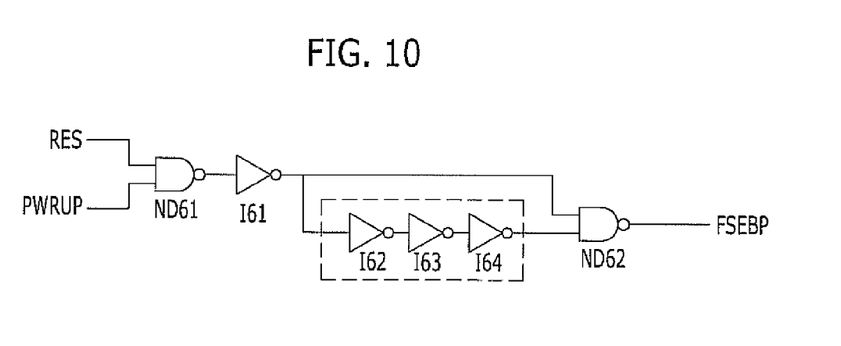
FIGS. 10 and 11 are circuit diagrams illustrating a control signal generator for generating a fuse enable control signal FSEBP shown in FIG. 5 in accordance with another exemplary embodiment of the present invention.
Figure 11:
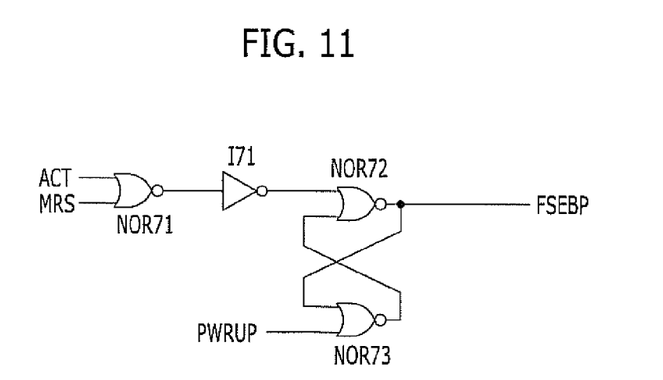

FIGS. 10 and 11 are circuit diagrams illustrating a control signal generator for generating the fuse enable control signal FSEBP shown in FIG. 5. The power-up signal PWRUP shown in FIGS. 10 and 11 is a signal which, for example, maintains a logic high level when the power source voltage VDD is increased higher than a predetermined voltage level. Further, FIG. 10 shows a reset signal RES which is a pulse signal which is enabled to a logic high level.

Referring to FIG. 10, the control signal generator generates the fuse enable control signal FSEBP in response to the reset signal RES and the power-up signal PWRUP. The control signal generator includes a first NAND gate ND61, first to fourth inverters I61, I62, I63 and I64, and a second NAND gate ND62. Herein, the reset signal RES may be an external reset signal or an internal reset signal. Further, the reset signal RES may be transferred from the outside after a power-up operation is completed. The control signal generator of FIG. 10 produces the same waveform as that of the fuse enable control signal FSEBP of FIG. 7.

Referring to FIG. 11, the control signal generator generates the fuse enable control signal FSEBP in response to an active signal ACT and a mode register set signal MRS, and it includes first to third NOR gates NOR71, NOR72 and NOR73, and a first inverter I71. Herein, the active signal ACT and the mode register set signal MRS are command signals that are transferred from the outside after a power-up operation is completed, and they are pulse signals that are enabled to a logic high level.

The fuse circuit in accordance with an exemplary embodiment of the present invention, which is described above, controls the potentials of both ends of the fuse F based on the fuse enable control signal FSEBP which is enabled after the power-up operation. In particular, whether the fuse F is cut or not may be stably detected in a present embodiment by coupling MOS transistors coupled with both ends of the fuse F in a duration where an operation of detecting whether the fuse F is cut or not is performed.

According to an exemplary embodiment of the present invention, generation of a defect occurring in a fuse of a fuse circuit may be prevented. Therefore, the reliability of a semiconductor memory device including the fuse circuit may be improved.

While the present invention has been described with respect to the specific embodiments, it will be apparent to those skilled in the art that various changes and modifications may be made without departing from the spirit and scope of the invention as defined in the following claims.

Furthermore, the logic gates and the transistors illustrated in the above-described embodiments of the present invention may be realized at different positions and in different forms according to the polarity of an input signal.

What is claimed is:

1. A fuse circuit, comprising:
a control signal generation unit configured to generate a control signal that is enabled after a moment when a power-up signal is enabled;
a potential control unit configured to control potentials of both ends of a fuse in response to the control signal; and
a fuse output unit configured to be initialized in response to the power-up signal and output a fuse signal in response to whether the fuse is cut or not.

2. The fuse circuit of claim 1, wherein the potential control unit comprises:
a first MOS transistor which is coupled between a power source voltage and the fuse and receives the control signal at its gate; and
a second MOS transistor which is coupled between the fuse and the fuse output unit and receives the control signal at its gate.

3. The fuse circuit of claim 1, wherein the potential control unit comprises:
a driver for driving one end of the fuse with a predetermined voltage in response to the control signal; and
a MOS transistor for electrically disconnecting the fuse and the fuse output unit from each other in response to the control signal.

4. The fuse circuit of claim 1, wherein the fuse output unit comprises:
an initializer for initializing a sense node of the fuse in response to the power-up signal; and
a latch for latching a logic level value of the sense node.

5. The fuse circuit of claim 1, wherein the control signal generation unit comprises:
a first delay unit for delaying a moment when the power-up signal is disabled by a first delay time;
a second delay unit for delaying an output signal of the first delay unit by a second delay time; and
an output unit for outputting the control signal in response to output signals of the first and second delay units.

6. The fuse circuit of claim 5, wherein the first delay time reflected in the first delay unit corresponds to a time from a moment when the power-up signal is disabled to a time when the control signal is enabled.

7. The fuse circuit of claim 5, wherein the second delay time resulting from the second delay unit corresponds to a time taken for detecting whether the fuse is cut or not.

8. The fuse circuit of claim 1, wherein the control signal is enabled in response to a reset signal.

9. The fuse circuit of claim 1, wherein the control signal is enabled in response to a command signal that is enabled after the power-up signal is enabled.

10. A method for operating a fuse circuit, comprising:
initializing a sense node where a value corresponding to whether a fuse is cut or not is detected in response to a power-up signal;
driving the sense node by detecting whether the fuse is cut or not;
outputting a fuse signal corresponding to whether the fuse is cut or not based on a logic level of the sense node; and
controlling potentials of both ends of the fuse after the driving of the sense node.

11. The method of claim 10, wherein the controlling of the potentials of both ends of the fuse comprises:
generating a control signal that is enabled after the initializing of the sense node; and
floating at least one end of the fuse in response to the control signal.

12. The method of claim 11, wherein the control signal is a signal obtained by delaying the power-up signal by a predetermined time from a moment when the power-up signal is disabled.

13. The method of claim 11, wherein the control signal is enabled in response to a reset signal.

14. The method of claim 11, wherein the control signal is enabled in response to a command signal that is enabled after the power-up signal is enabled.

* * * * *